US008860131B2

(12) United States Patent
Zara

(10) Patent No.: US 8,860,131 B2
(45) Date of Patent: *Oct. 14, 2014

(54) METHOD FOR MANUFACTURING A POWER DEVICE BEING INTEGRATED ON A SEMICONDUCTOR SUBSTRATE, IN PARTICULAR HAVING A FIELD PLATE VERTICAL STRUCTURE AND CORRESPONDING DEVICE

(71) Applicant: STMicroelectronics S.r.l., Agrate Brianza (IT)

(72) Inventor: Fabio Zara, Mascalucia (IT)

(73) Assignee: STMICROELECTRONICS S.r.l., Agrate Brianza (MB) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 13/801,975

(22) Filed: Mar. 13, 2013

(65) Prior Publication Data
US 2013/0270630 A1  Oct. 17, 2013

Related U.S. Application Data

(62) Division of application No. 12/974,778, filed on Dec. 21, 2010, now Pat. No. 8,558,305.

(30) Foreign Application Priority Data

Dec. 28, 2009 (IT) .............. MI09A002314

(51) Int. Cl.
*H01L 29/66* (2006.01)
*H01L 29/423* (2006.01)
*H01L 29/78* (2006.01)
*H01L 21/28* (2006.01)
*H01L 29/40* (2006.01)
*H01L 29/45* (2006.01)
*H01L 29/49* (2006.01)

(52) U.S. Cl.
CPC .......... *H01L 29/7827* (2013.01); *H01L 29/456* (2013.01); *H01L 29/4933* (2013.01); *H01L 29/42368* (2013.01); *H01L 29/42372* (2013.01); *H01L 29/4236* (2013.01); *H01L 29/7813* (2013.01); *H01L 21/2815* (2013.01); *H01L 29/4238* (2013.01); *H01L 29/66734* (2013.01); *H01L 29/42376* (2013.01); *H01L 29/407* (2013.01)
USPC .......... 257/330; 257/331; 257/332; 257/333; 257/334

(58) Field of Classification Search
USPC .......................... 257/330, 331, 332, 333, 334
See application file for complete search history.

(56) References Cited

U.S. PATENT DOCUMENTS 7,005,351 B2  2/2006  Henninger et al.
7,183,610 B2  2/2007  Pattanayak et al.
(Continued)

OTHER PUBLICATIONS

Search Report based on Italian Application Serial No. MI20092314, Ministero dello Sviluppo Economico, Munich, Sep. 6, 2010, pp. 2.

*Primary Examiner* — Tan N Tran
(74) *Attorney, Agent, or Firm* — Graybeal Jackson LLP

(57) ABSTRACT

An embodiment of a power device comprising and formation of at least one gate region, of at least one buried source region, of at least one body region and of at least one source region; at least one body/source contact and at least one buried source contact; and formation of a source contact region and of a gate contact region through deposition. An embodiment of the method also comprises formation of the at least one gate region and of the at least one buried source region, electrically insulated, through a single deposition of a conductive filling material on an epitaxial layer, on vertical walls of the trench and within the empty region; and through etching of the conductive filling material forming a first spacer and a second spacer, suitable for serving as a gate electrode and forming a buried source electrode within the empty region.

15 Claims, 16 Drawing Sheets

(56) References Cited

U.S. PATENT DOCUMENTS

| | | |
|---|---|---|
| 7,372,103 B2 | 5/2008 | Zundel et al. |
| 7,482,654 B2 | 1/2009 | Cao et al. |
| 7,504,303 B2 | 3/2009 | Yilmaz et al. |
| 7,557,409 B2 | 7/2009 | Pattanayak et al. |
| 8,558,305 B2 * | 10/2013 | Zara .............................. 257/330 |
| 2004/0089910 A1 | 5/2004 | Hirler et al. |
| 2006/0211189 A1 * | 9/2006 | Siemieniec et al. .......... 438/212 |
| 2007/0296039 A1 | 12/2007 | Chidambarrao et al. |
| 2009/0152624 A1 | 6/2009 | Hiller et al. |
| 2011/0156140 A1 | 6/2011 | Zara |

* cited by examiner

METHOD FOR MANUFACTURING A POWER DEVICE BEING INTEGRATED ON A SEMICONDUCTOR SUBSTRATE, IN PARTICULAR HAVING A FIELD PLATE VERTICAL STRUCTURE AND CORRESPONDING DEVICE

RELATED APPLICATION DATA

The instant application is a Divisional of U.S. patent application Ser. No. 12/974,778 filed on Dec. 21, 2010, which claims priority to Italian Patent Application No. MI2009A002314, filed Dec. 28, 2009, which application is incorporated herein by reference in its entirety.

TECHNICAL FIELD

An embodiment relates to a method for manufacturing a power device integrated on a semiconductor substrate.

An embodiment also relates to a power device integrated on semiconductor substrate.

An embodiment particularly, but not exclusively, relates to a method for manufacturing a power device integrated on a semiconductor substrate, of the type comprising a three-dimension vertical field plate structure, chosen among: for example a MOSFET device, or a MISFET device, or an IGBT device, or a BJT device, or a junction diode or a Schottky diode, and the following description is made with reference to this field of application by way of illustration only.

BACKGROUND

MOSFET devices, which may operate at medium and high voltage, besides being used for executing several functions, for example, for DC/DC conversion, for the charging and for the protection of batteries, and inside lamps, are used in automotive applications. In the applications relative to this field, it also may be important to dissipate a minimum amount of heat, even if high currents are being drawn. For reaching high values of biasing inverted voltage BVdss of a planar MOSFET device, one may increase the thickness of its epitaxial layer and its resistivity. This implies the increase of the input resistance Rdson of the MOSFET device at the current flow through the device itself, and, in consequence, a greater amount of dissipated heat.

At present, n-channel MOSFET devices of medium and high voltage may be realized with different structures according to manufacturing needs. More in detail, the structure of a MOSFET device integrated on a semiconductor substrate may be conventionally of the planar type, or, alternatively, realized with a trench, or of the super-junction type, or also of the field-effect or field-plate type.

In a MOSFET device integrated on a semiconductor substrate, for example of silicon, the value of the resistance Rdson depends on the value of the breakdown voltage BVdss, according to the relation: $Rdson \sim BVdss^{2.5}$. In consequence, the value of the resistance Rdson also depends on the thickness and on the concentration of the epitaxial layer being grown on the silicon substrate.

To overcome this problem, MOSFET devices may be realized with the field-control-electrodes technique, or field plate, for eliminating the dependence of the resistance Rdson on the value of the breakdown voltage BVdss and, thus, on the thickness and on the concentration of the epitaxial layer. By way of example, FIG. 1 shows an enlarged view of a section of a MOSFET device 1 integrated on a semiconductor substrate 2 with a field-plate structure. The MOSFET device 1 comprises an epitaxial layer 3 that is grown on the substrate 2 (Substrate) and constitutes the drain region of the device. The device 1 also comprises buried source regions 4 realized by making, in the epitaxial layer 3, a trench 5 and filling it, in a first step, with a dielectric material 6, for example a thick oxide, that remains on the walls of the trench 5 and, in a second step, with a conductive material, for example through a first deposition of a polysilicon layer. This polysilicon layer is then subjected to masking and etching with consequent retrogression of the thick oxide layer 6. A gate oxide layer 7 and a second polysilicon layer are then realized, and then subjected to photomasking and etching. Within the epitaxial layer 3, in correspondence with the buried source regions 4, gate regions 8 (Gate electrode) are then realized. Subsequently, in the epitaxial layer 3, through implantation of different doping species, body regions 9 are realized and, within these, source regions 10. As it is clear also from the structure shown in FIG. 2, these steps follow: —deposition of a dielectric layer 11 useful for sealing the structure; —realization of a trench or micro-trench 12 in the body 9 and source 10 regions; —covering of the micro-trench with a metallic layer (for example tungsten) 13 for creating the contact with the body 9 and source 10 regions; —formation, through metallization, of a drain contact region 14 (Drain metal) and of a source contact region 15 (Source metal).

In practice, the field-plate technique is based on the application to the buried source electrode 4 of a suitable external voltage, that produces, in the epitaxial layer 3, a depleting of majority carriers through field-effect. The epitaxial layer 3, behaving as an intrinsic semiconductor, may then sustain high inverse breakdown voltages BVdss and, as effect of the depleting of the carriers further to the modulation of the voltage on the buried source electrode 4, may have high dopant concentrations and low values of the resistance component $R_{epy}$ Rdson due to the resistance of the epitaxial layer.

Embodiments of the field-plate technique for the realization of MOSFET devices are described in the following U.S. patents and patent applications: U.S. Pat. Nos. 7,504,303, 2004/0089910, 2007/0296039, 7,005,351, 7,372,103, 7,482, 654, 7,183,610, and 7,557,409, which are incorporated by reference.

However, known application of the field-plate technique may have the drawback of being quite expensive and disadvantageous as to the electric performances of the device. For example, for the realization of the gate region, it may be necessary to execute two separate steps of deposition of polysilicon layers and, due to this, the insertion of a parasitic capacitance C may also be created between the buried source region 4 and the gate region 8, as shown in FIG. 2.

SUMMARY

An embodiment is a method for manufacturing MOSFET devices integrated on semiconductor substrate with a field-plate structure and the corresponding MOSFET device, having such structural and functional features as to allow a reduction of the method steps and to obtain in the meantime advantageous electric characteristics although using low-cost manufacturing methods, thus overcoming limits and/or the drawbacks still limiting conventional field-plate MOSFET devices.

An embodiment is a method for manufacturing a MOSFET device integrated on a semiconductor substrate, comprising a field plate structure. The method comprises a single step of deposition of a polysilicon layer to form the buried source region and the gate region, which is made of two spacers being realized above the buried source region.

An embodiment is a method for manufacturing a power device integrated on a semiconductor substrate comprising the steps of:

growth on said substrate of an epitaxial layer;

photo-lithography and etching of said epitaxial layer for the formation of at least one deep trench;

deposition of a thick layer of dielectric material with partial filling of said at least one trench;

complete filling of said at least one trench with a layer of sacrificial material;

selective etching of said thick layer of dielectric material with consequent retrocession below said layer of sacrificial material;

selective etching of said layer of sacrificial material with consequent formation of an empty region within said at least one trench;

growth of a layer of gate oxide;

formation of at least one gate region, of at least one buried source region, of at least one body region and of at least one source region;

deposition of a dielectric layer;

simultaneous formation of at least one gate contact, of at least one body/source contact and at least one buried source contact;

formation of a source contact region and a gate contact region through deposition, masking and etching of a metallization layer.

In an embodiment, said formation step of at least one gate region and of at least one buried source region, both electrically insulated, comprises the steps of:

executing a single deposition of a conductive filling material on said epitaxial layer, on the vertical walls of said trench and within said empty region;

etching said conductive filling material forming a first spacer and a second spacer, suitable for serving as a gate electrode and forming a buried source electrode within said empty region.

More in particular, an embodiment comprises the following optional characteristics, taken separate or in combination with each other when needed.

According to an embodiment, said formation step of at least one deep trench comprises the formation of at least one enlarged portion and at least one narrow portion.

According to another embodiment, the material of said conductive filling layer is chosen in the group made of:

polysilicon;

metal.

According to another embodiment, the material of said separation layer is made of two different materials used in a suitable way and chosen in the group:

dielectric;

metallic silicide.

Moreover, according to an embodiment, said formation of a first spacer and a second spacer comprises the formation of a first and a second spacer in said at least one enlarged portion and a first and a second spacer in said at least one narrow portion.

According to a further embodiment, said first and second spacer are joined in said at least one narrow portion.

Moreover, according to another embodiment, the method also comprises a deposition step, on the gate electrode and on the buried source electrode, of a separation layer.

According to a further embodiment, said complete filling step of said at least one trench with a layer of sacrificial material uses a filling material different from a material deposited by said deposition step of a dielectric layer.

Moreover, according to an embodiment, said deposition step of a dielectric layer deposits silicon oxide and said complete filling step of said at least one trench with a layer of sacrificial material uses a material chosen among resist, bark, silicon nitride and polysilicon.

An embodiment is a power device integrated on a semiconductor substrate and comprising:

an epitaxial layer;

at least one deep trench partially covered by a thick layer of dielectric material and comprising a buried source region;

a layer of gate oxide;

at least one gate region, at least one buried source region, at least one body region and at least one source region;

a dielectric layer;

at least one gate contact and at least one buried source contact;

at least one drain contact region and one source contact region.

In an embodiment said gate region comprises a first spacer and a second spacer being simultaneously realized with the formation of said buried source region.

According to an embodiment, said trench comprises at least one enlarged portion of width D1 and at least one narrow portion of width D2 being lower than D1, said enlarged and narrow portions having, in the conjunction region, walls oriented at an angle $\alpha$ comprise between approximately 10° and 90°.

According to an embodiment, said first spacer and second spacer respectively comprise a first and a second spacer in said at least one enlarged portion and a first and a second spacer in said at least one narrow portion.

According to an embodiment, said first and second spacers are joined in said at least one narrow portion.

Furthermore, according to an embodiment, said at least one narrow portion comprises a plurality of gate contacts and said at least one enlarged portion comprises a plurality of buried source contacts.

Furthermore, according to an embodiment, the buried source contacts of said plurality are very close to each other, the distance between a contact and the successive one being comparable to the dimension of a contact.

Moreover, according to an embodiment, said plurality of gate contacts comprises a chain of gate contacts arranged on the edge of said at least one trench.

According to an embodiment, the buried source contacts of said plurality are very far from each other, the distance between a contact and the successive one being at least approximately 10 times bigger than the dimension of a contact.

Moreover, according to an embodiment, said plurality of buried source contacts comprises a single contact being positioned in the middle of said at least one portion.

According to an embodiment, said plurality of buried source contacts comprises a first and a second buried source contact positioned at the edge of said portion.

Furthermore, according to an embodiment, the plurality of buried source contacts comprises a single large buried contact positioned in the middle of said portion, having a ratio between its greater dimension and its smaller dimension equal to at least approximately 10.

According to an embodiment, said plurality of buried source contacts comprises a single large buried contact positioned within a source finger realized in the middle of said portion.

Finally, according to an embodiment, the buried source contacts of said plurality are very close to each other and said plurality of gate contacts comprises a chain of gate contacts arranged on the edge of said at least one trench, said trench comprising at least one enlarged portion and a single narrow portion.

According to an embodiment, the thick layer of dielectric material retrocedes below said sacrificial layer of a distance comprised between approximately 1 μm and 2 μm.

According to an embodiment, the maximum value P of the thickness of said filling layer on the vertical walls of the trench is greater than half the value T of the thickness of said layer in the empty region and smaller than the thickness F of said thick dielectric layer.

Again, according to an embodiment, the deep trench comprises the formation of an enlarged portion and at least one narrow portion.

According to an embodiment, the width D2 of the narrow portion is smaller or identical to double the value F of the thickness of the thick dielectric layer.

BRIEF DESCRIPTION OF THE DRAWINGS

Characteristics and advantages of a method and of a semiconductor device according to at least one embodiment will be apparent from the following description thereof given by way of indicative and non-limiting example with reference to the annexed drawings.

In these drawings.

DETAILED DESCRIPTION

With reference to these figures, an embodiment of a method for manufacturing a power device integrated on a semiconductor substrate and comprising a vertical and three-dimension field plate structure is now described in detail. In particular, an embodiment of a manufacturing method allows realizing a power MOSFET device with a field-plate structure by using a single deposition of polysilicon layer for the simultaneous formation of the gate electrode and of the buried source electrode.

Moreover, the figures showing schematic views of portions of integrated devices during the manufacturing steps may not be drawn to scale, but they are described in such a way as to highlight features of embodiments.

An embodiment has the aim of optimizing a manufacturing method and the electric characteristics of a power device, in particular based on a vertical field-plate structure, using a simpler and less expensive method with respect to conventional methods.

As it will be clarified by the following description, an embodiment of a method combines conventional steps and innovative steps for realizing a single polysilicon deposition for the formation of the gate and buried source electrodes. According to an embodiment, a deep trench is realized having a narrowing in its end portions.

Figure 1:
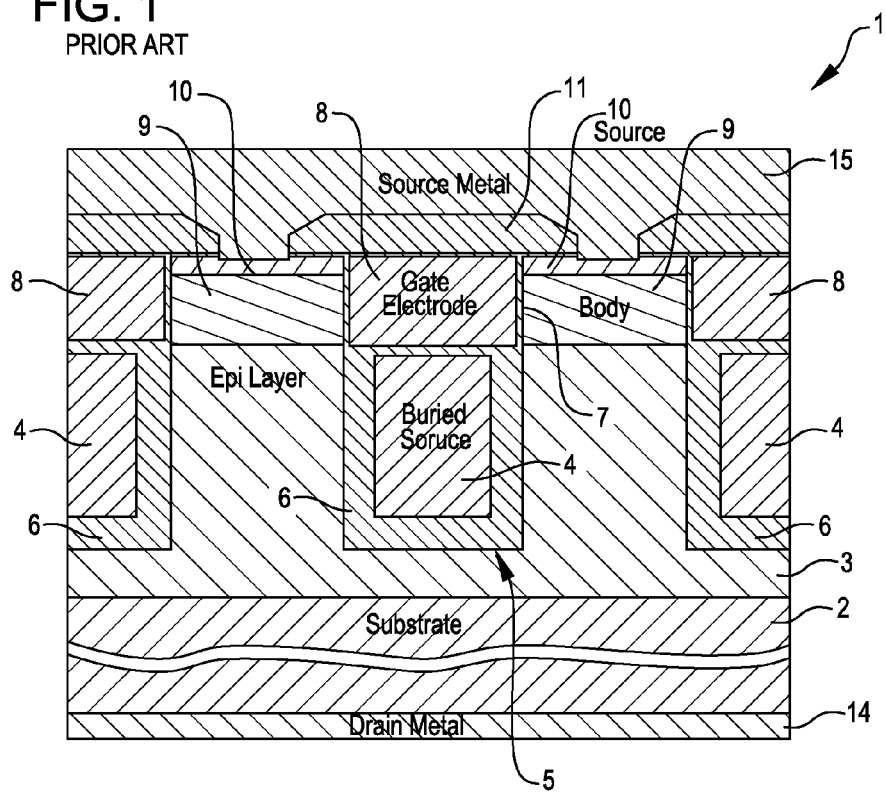
FIGS. 1 and 2 show schematic, enlarged, vertical section views of a conventional power MOSFET device with a field plate structure.
Figure 2:
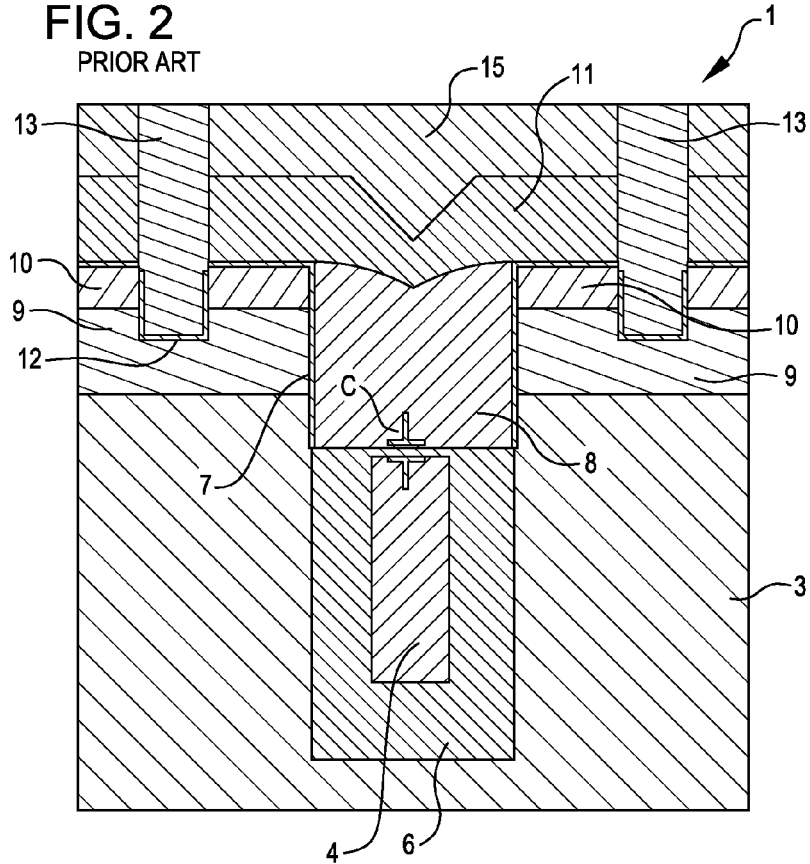
Figure 3:
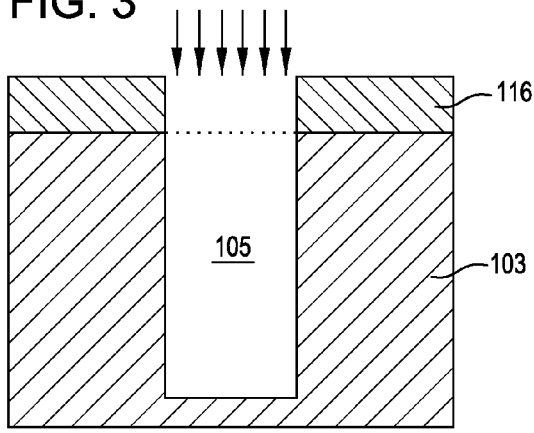
FIGS. 3 to 11 show respective schematic, section views of a conventional power MOSFET device with a field plate structure, during the successive steps of a manufacturing method.
Figure 4:
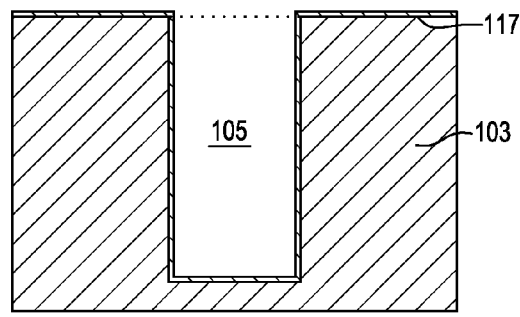
Figure 5:
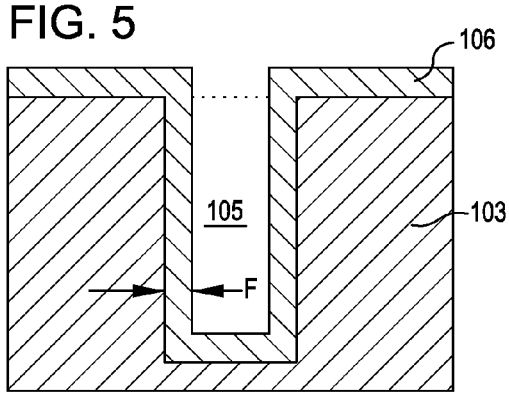
Figure 6:
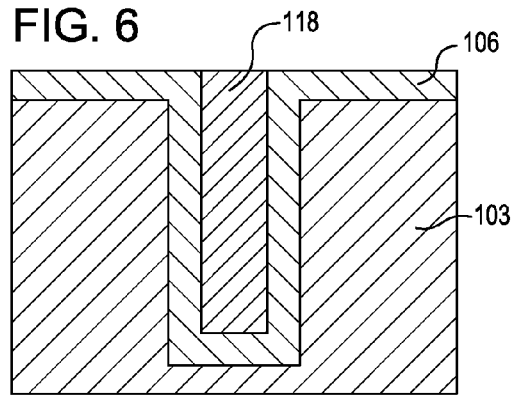
Figure 7:
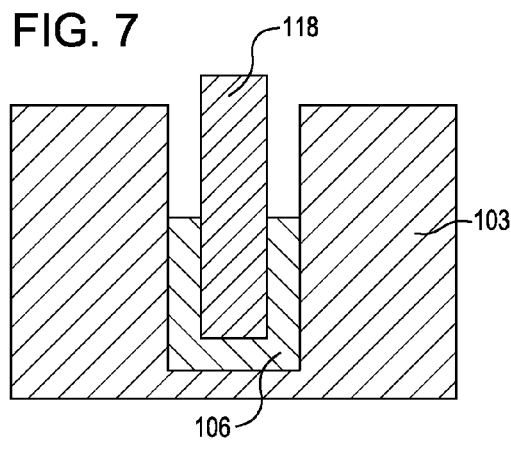
Figure 8:
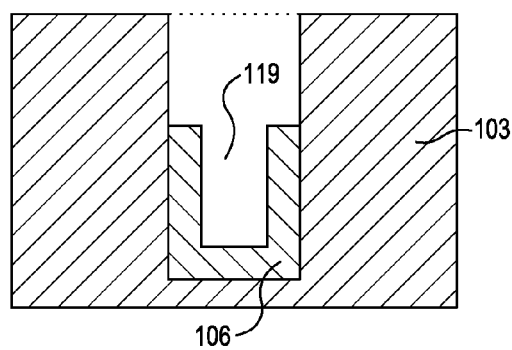
Figure 9:
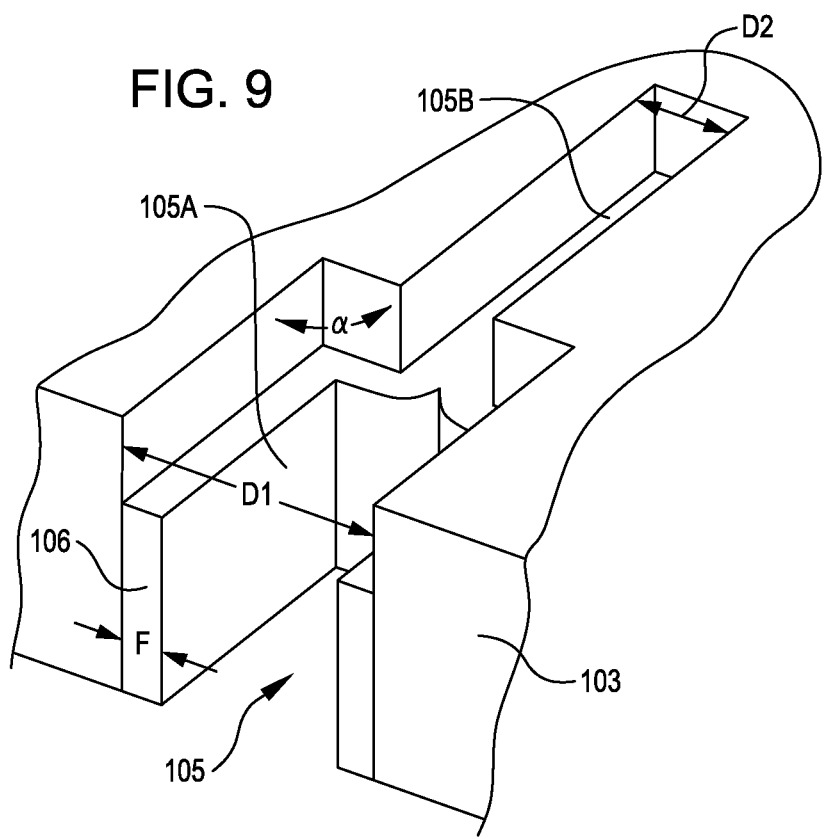
Figure 10:
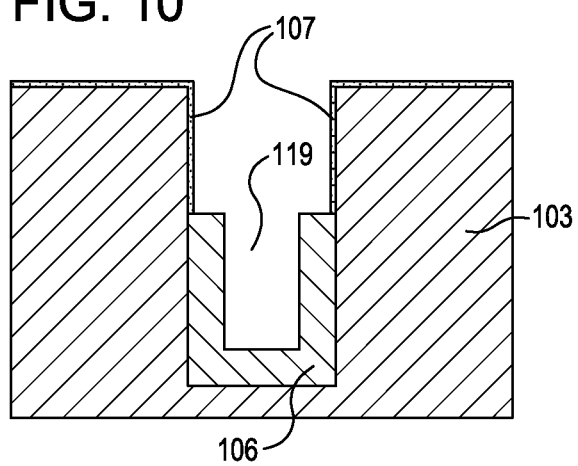
Figure 11:
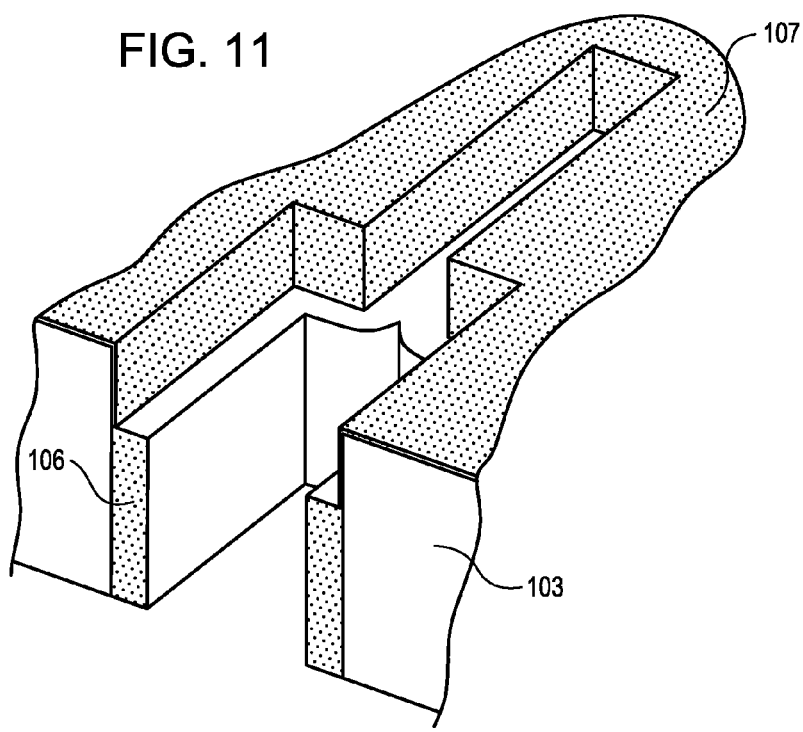

In particular, with reference to FIGS. 3 to 11, a conventional method for manufacturing a MOSFET device 100 with the field-plate technique comprises:

growth on a silicon substrate, not shown in the figures, of an epitaxial layer or silicon bulk 103;

conventional photo-lithography of the epitaxial layer, as shown in FIG. 3, through a first deposition of a hard mask layer 116 of dielectric material, deposition of a resist film, not shown in the figure, on the whole surface of the hard mask layer 116; masking through a photo-lithographic mask; UV exposure of the resist film in the areas not covered by the mask; development of the resist film in exposed areas; etching through the window defined by the photo-exposed resist film; removal of the resist film; etching of the epitaxial layer 103 for the formation of a deep trench 105 through the window defined by the hard mask layer 116;

removal of the hard mask layer 116; growth of a sacrificial layer 117 of dielectric material, for example silicon oxide, useful for compensating the damages caused by the etching step to the surface of the epitaxial layer 103, as shown in FIG. 4;

deposition of a dielectric layer 106, in particular of thick oxide, for example TEOS, of thickness F suitably chosen according to the class of voltage of the device MOS and that partially fills in the trench 105, as shown in FIG. 5;

filling of the trench 105 with a layer of sacrificial material, 118, for example resist or bark, silicon nitride or polysilicon and planarization of the surface of the epitaxial layer 103, as shown in FIG. 6;

controlled wet etching of the dielectric layer 106 with consequent retrocession below the surface of the epitaxial layer 103 of a distance comprised between approximately 1 μm and 2 μm, as shown in FIG. 7;

selective etching of the layer of sacrificial material 118 with consequent formation of an empty region 119 within the trench, as shown in FIGS. 8 and 9;

growth of a layer of gate oxide 107, as shown in FIGS. 10 and 11.

For executing the selective etching of the layer of sacrificial material 118, the material used for this layer is different with respect to the material used for the dielectric layer 106. In particular, if for the dielectric layer 106 silicon oxide is used, the layer of sacrificial material 118 may be resist, bark (a material similar to the resist but much more conformal), silicon nitride, or polysilicon.

Moreover, according to an embodiment, phototechnique is not necessary for removing the layer of sacrificial material 118. In fact an immersion wet etching may be used being specific for the sacrificial material of this layer 118. In particular, by using resist, bark, nitride or polysilicon for this layer of sacrificial material 118, the selectivity may be so high, with respect to the, e.g., silicon oxide that realize the dielectric layer 106, that an additional photomasking may be saved.

As it appears evident from FIG. 9, in an embodiment the trench 105 has a narrowing in its end part and, in particular, it comprises an enlarged portion 105A of width D1 and a narrow portion 105B of width D2 being smaller than D1. These portions, in the junction region, have walls oriented at an angle α comprised between approximately 10° and 90°.

Figure 12:
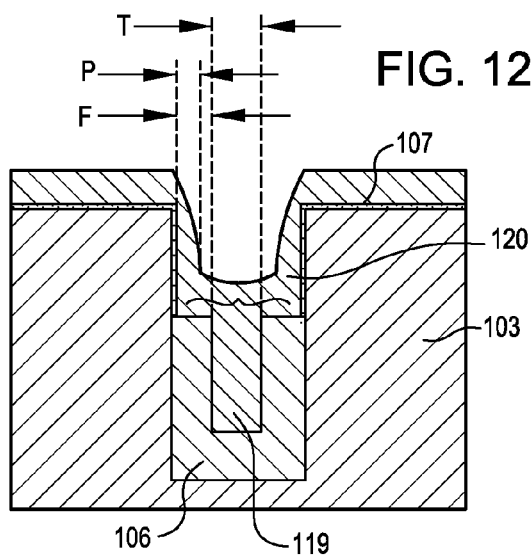
FIGS. 12 to 15 and 17 to 25 show schematic, enlarged, vertical section views of a power MOSFET device with a field plate structure during successive steps of an embodiment of a manufacturing method.

With particular reference to the examples of FIGS. 12 to 25, a method according to an embodiment goes on with a deposition step of a conductive filling layer, in particular polysilicon 120 on the surface of the epitaxial layer 103, on the vertical walls of the trench 105 and within the region 119. P indicates the maximum value of the thickness of this polysilicon layer 120 on the vertical walls of the trench 105 and T indicates a process value equal to the difference between the width D1 of the enlarged portion 105A and twice the thickness of the dielectric layer 106, in particular thick oxide (T=D1−2F), i.e. the width of the trench minus the two lateral layers, as shown in FIG. 12. Both these values may be chosen during the design step according to the class of voltage. To fill in with the polysilicon layer 120 the whole width of the T of the cavity 119 it may be enough that P is greater than or equal to half T (P≥T/2).

The width D2 of the portion 105B of the trench 105 may be smaller or equal to double the value F of the thickness of the dielectric layer 106, in particular thick oxide, (D2≤2F). In this way, the trench 105B of width D2 may be completely filled in by the dielectric layer 106, without cavity inside, as shown for example in FIG. 9.

In substance, in the design of an embodiment of the MOSFET device 100, the following rules are to be taken into consideration:

$(T/2) \leq P \leq F$; and $D2 \leq 2F$ in particular, as shown in FIG. 12, the value of the thickness P is greater than T/2 to allow the formation of a buried source region of thickness smaller than or equal to the value 2F for the formation of a gate region.

Figure 13:
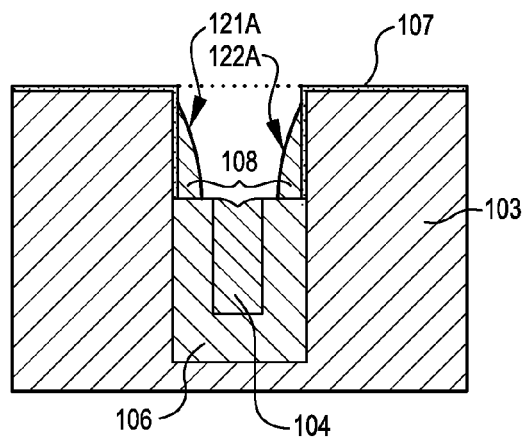
Figure 14:
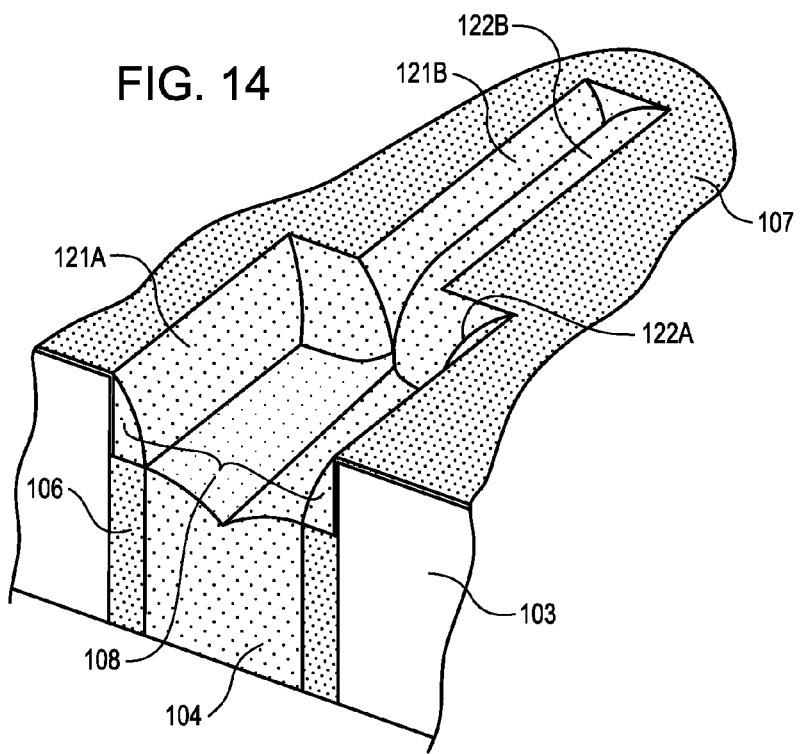

Therefore, as shown in FIG. 13, an embodiment goes on with the execution of a dry anisotropic etching step of the polysilicon layer 120, which determines the formation of a first and of a second spacer 121A and 122A of polysilicon on the vertical walls of the front portion 105A of the trench 105 and of spacers 121B and 122B on the vertical walls of the narrow portion 105B of the trench 105, which, as effect of the narrowing of the trench in this narrow portion 105B, are joined together. FIG. 14 also shows the three-dimensional section of the structure shown in FIG. 13 wherein it is evident that, as an effect of the narrowing of the trench 105 in its narrow portion 105B, the spacers 121A and 122B are joined together in this narrow portion 105B.

During the etching step of the polysilicon layer, the buried source region 104 and the gate region 108, shown in FIGS. 13 and 14 are simultaneously realized.

Figure 15:
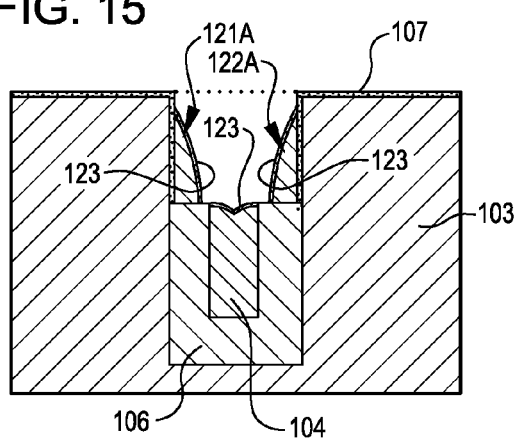
Figure 16:
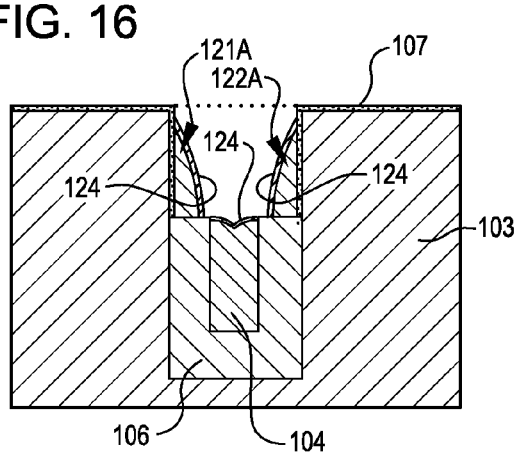
FIG. 16 shows the schematic, section view of a power MOSFET device with field plate structure during a realization step of a gate electrode according to an embodiment.

The successive step of a method according to an embodiment consists in the formation of a thin oxide layer 123 on the spacers 121 and on the buried source region 104, as shown in FIG. 15, obtained through thermal oxidation and having the aim of creating a further insulating layer between the gate electrode and the buried source electrode and oxidizing possible conductive bridges between the gate region 108 and the buried source region 104.

In an embodiment, after the formation of the spacers 121 and 122, the following successive steps are executed: —sputtering of a metallic layer, for example Cobalt (Co) or Titanium (Ti) or Tungsten (W); —Rapid Thermal Annealing (RTA). The structure is then obtained, shown in FIG. 16, which comprises a layer 124 of metallic silicide, for example cobalt silicide ($CoSi_2$) or titanium silicide (TiSi) or tungsten silicide (WSi).

The metallic silicide may be useful to remarkably reduce the value Rg of the gate resistance of the device and, in consequence, to obtain high switch speed of the device and low losses in dissipation during the transients.

In an embodiment, the successive manufacturing steps of the device are conventional, but they are described hereafter for completeness of description.

Figure 17:
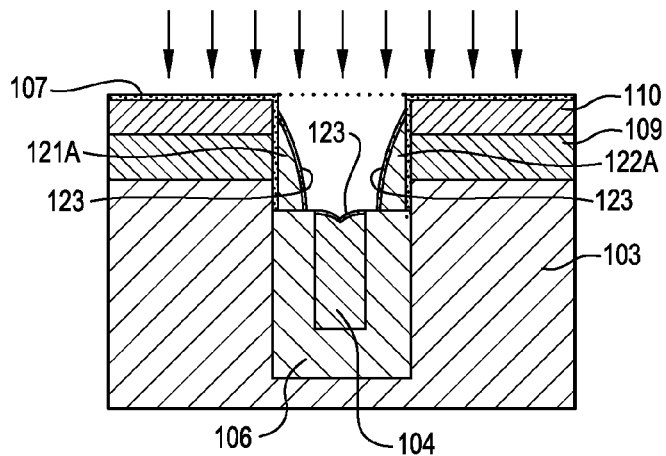
Figure 18:
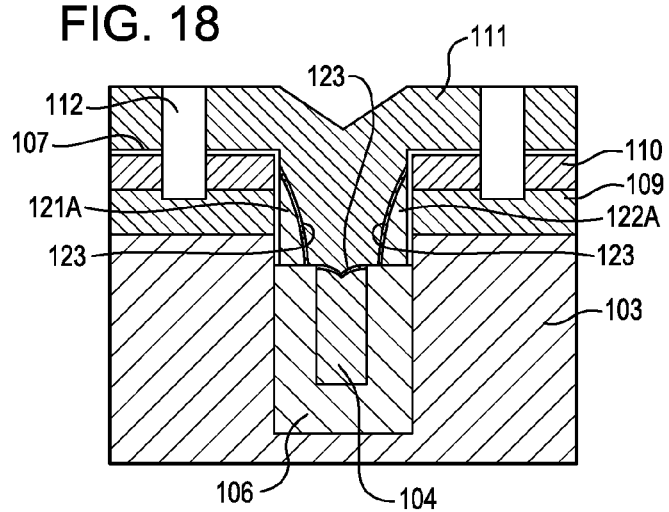
Figure 19:
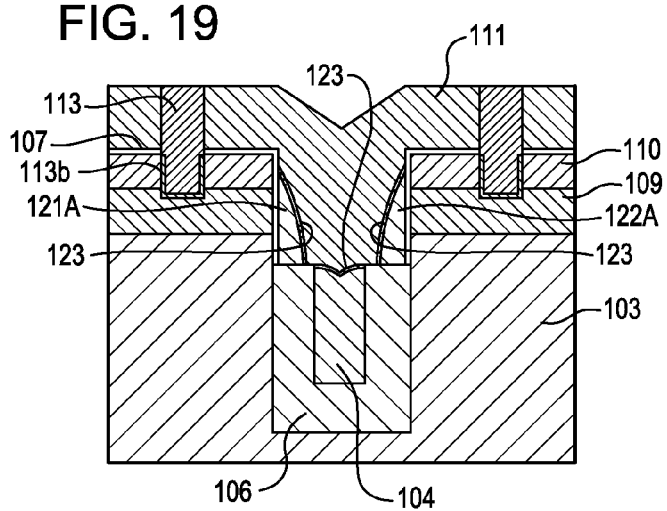

In particular, an embodiment of the method comprises the steps of:

implantation of a body region 109 and of a source region 110, followed by a suitable diffusion for activating the implanted doping species and the formation of the channel region, as shown in FIG. 17;

deposition of a dielectric layer 111, for example glass boron-phosphosilicate or BPSG, useful for sealing and insulate the structure from the successive step of source metallization; masking and etching for realizing, in the body 109 and source 110 region, a trench or micro-trench 112 useful for defining the body and source contacts, as shown in FIG. 18;

sputtering of a barrier metallic layer 113b, for example titanium silicide ($TiSi_2$; deposition of a contact tungsten layer 113, or WPlug, for filling the micro-trench 112; planarization, as shown in FIG. 19.

Figure 20:
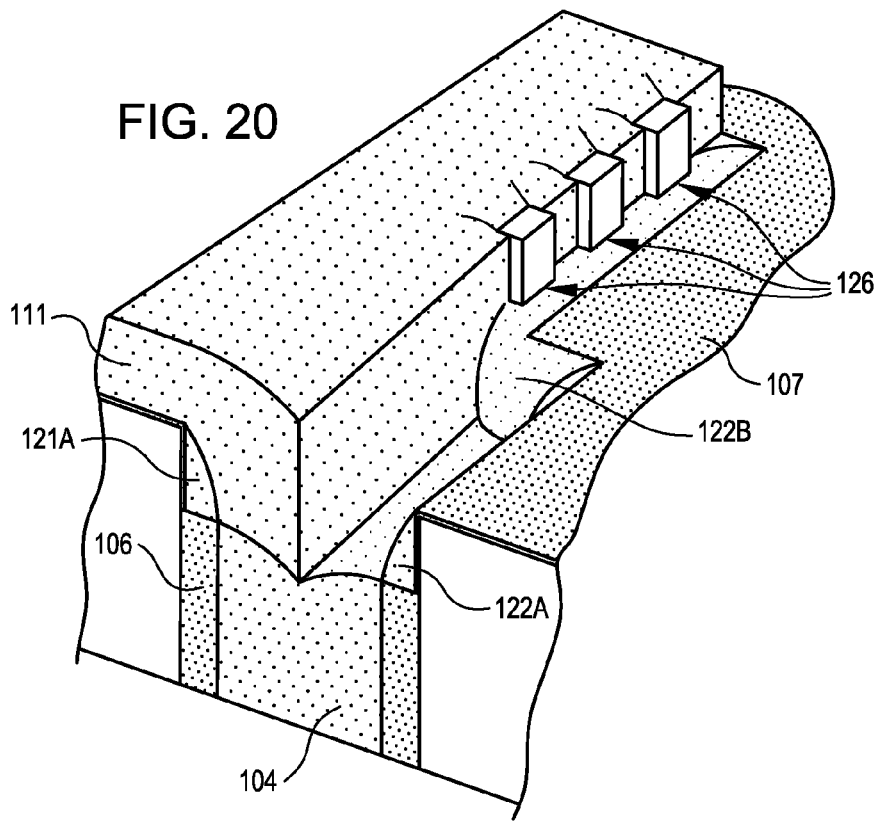

In consequence of the fact that the spacers 121B and 122B are joined together in the narrow portion 105B of the trench 105, it may be possible to contact the gate region or electrode through gate contacts realized in this narrow portion 105B. FIG. 20 shows the three-dimensional section of the structure of FIG. 19 comprising gate contact regions 126 realized in the narrow portion 105B of the trench 105 and that serve as a contact with the polysilicon layer 120 in electric continuity with the spacers 121A and 122A.

In particular, in an embodiment, the tungsten layer simultaneously realizes both the contacts 113 on the active silicon area, and the contacts 125 for the buried source of the polysilicon layer 104. Subsequently, as it will be described hereafter, one metallic layer 115 short-circuits the active area contacts 113 with those realized on the buried source 125. The barrier layer 113b, in particular a silicide in an embodiment, is realized under all the contacts, both of active area 113, and on the buried source 125, and on the gate 126. This barrier layer 113b is shown for example in FIGS. 19 and 25, but it is not always indicated in all the other figures so as not to burden their representations.

A drain contact is instead realized with a metallization on the rear of the slice, this metallization being independent from the one used for creating the source electrode, with a process being shared by vertical PowerMOSFET devices independently from the technology and neither described nor shown in the figures.

Figure 21:
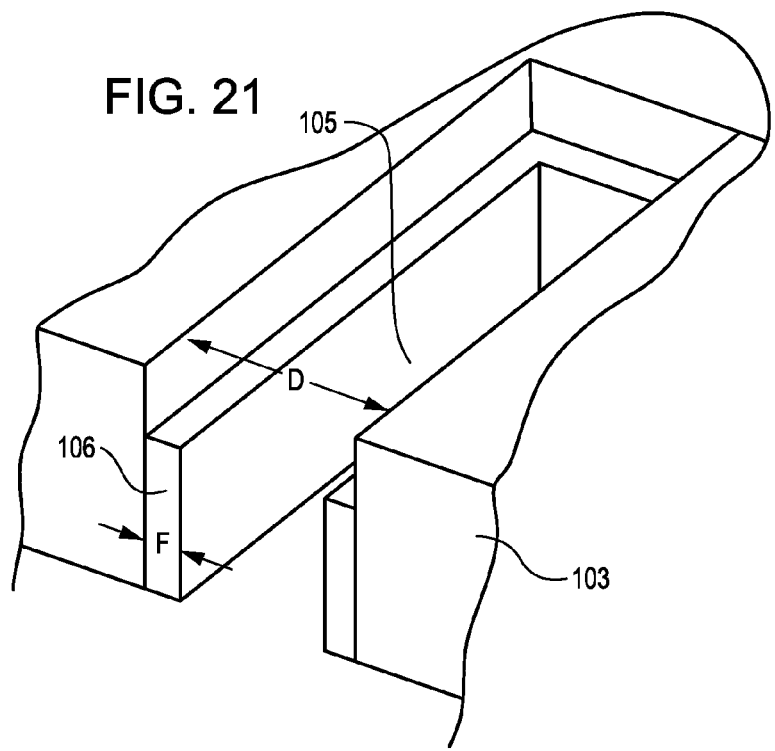

An embodiment of the method goes on with process steps useful to realize the contacts for the buried source electrode 104. Without depriving the generality of the description of anything and for sake of figure simplicity, the description of these steps is made considering a trench 105 that does not show a narrowing in the end portion. In this case, with a method according to an embodiment, the structure shown in 3D view in FIG. 21 is realized, passing through the steps of: formation of the trench; growth of a sacrificial oxide layer; deposition of a dielectric layer; filling of the trench with a sacrificial layer; reduction of the dielectric layer through etching; removal of the sacrificial layer.

Figure 22:
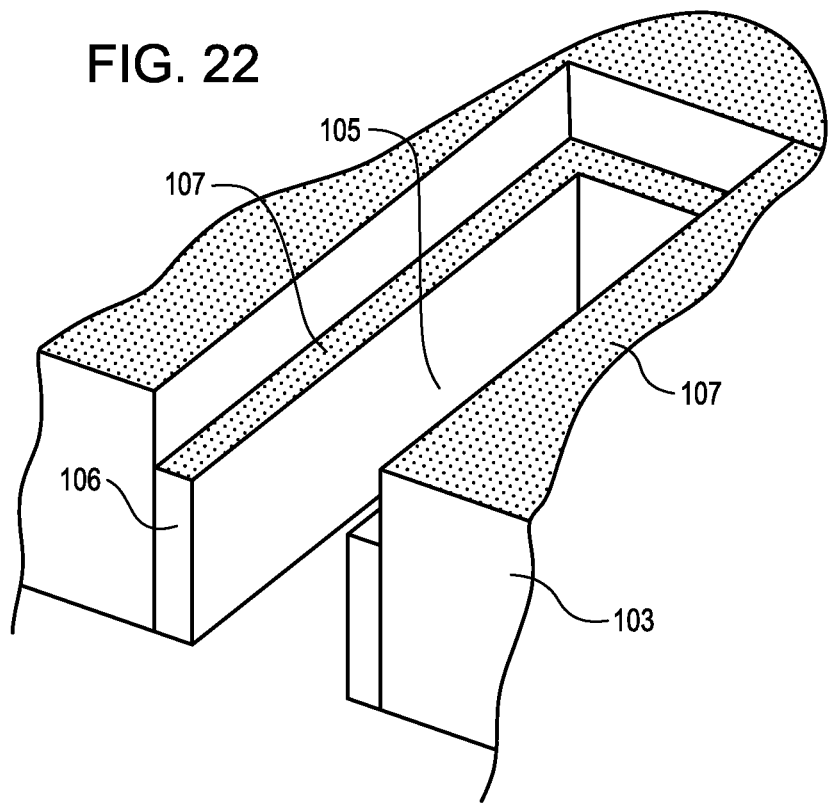
Figure 23:
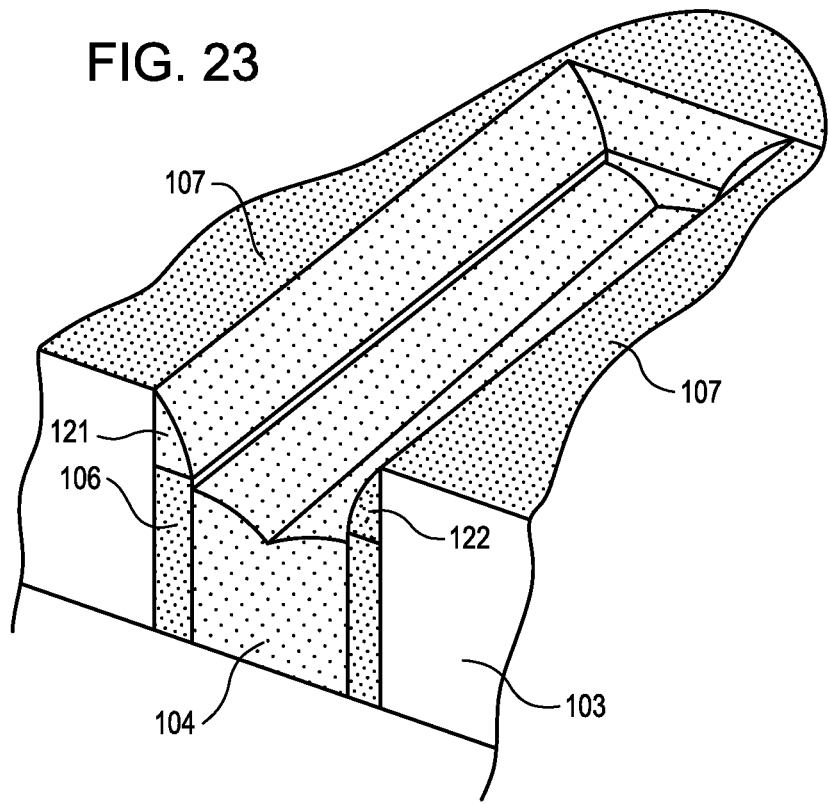
Figure 24:
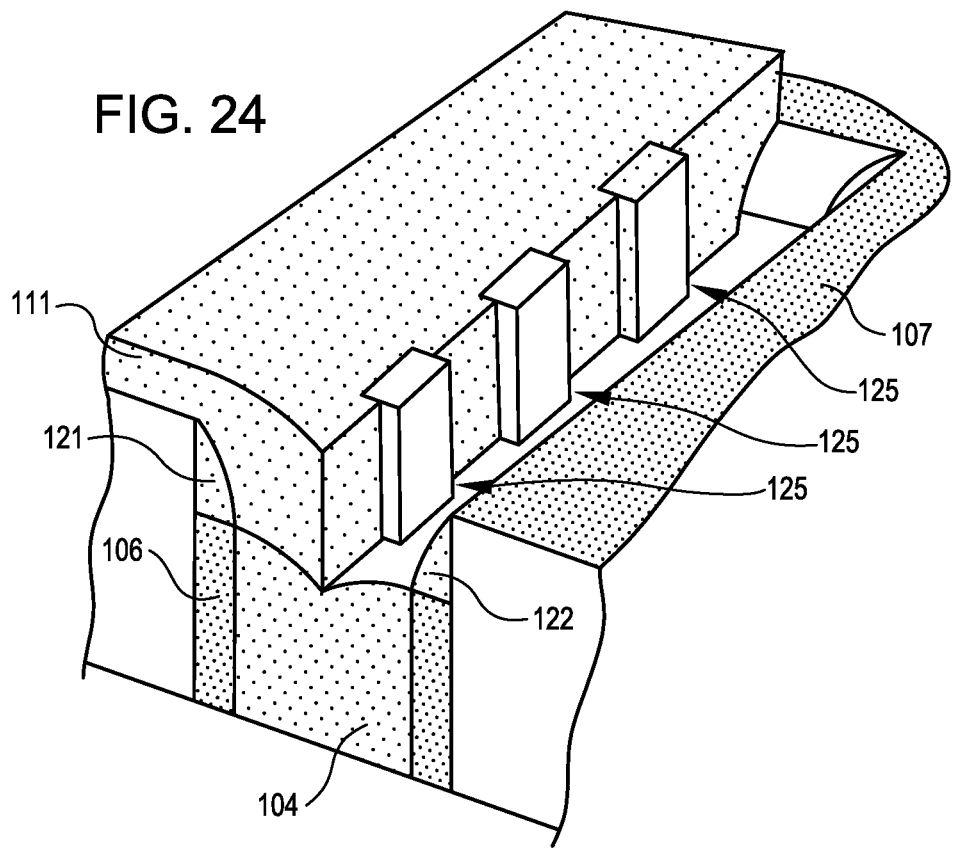

FIGS. 22, 23 and 24 respectively show the 3D images of the structure formed further to the steps of: gate oxidation; deposition of the polysilicon layer for the formation of spacers; and formation of the source contacts 125 buried in the trench 105.

Figure 25:
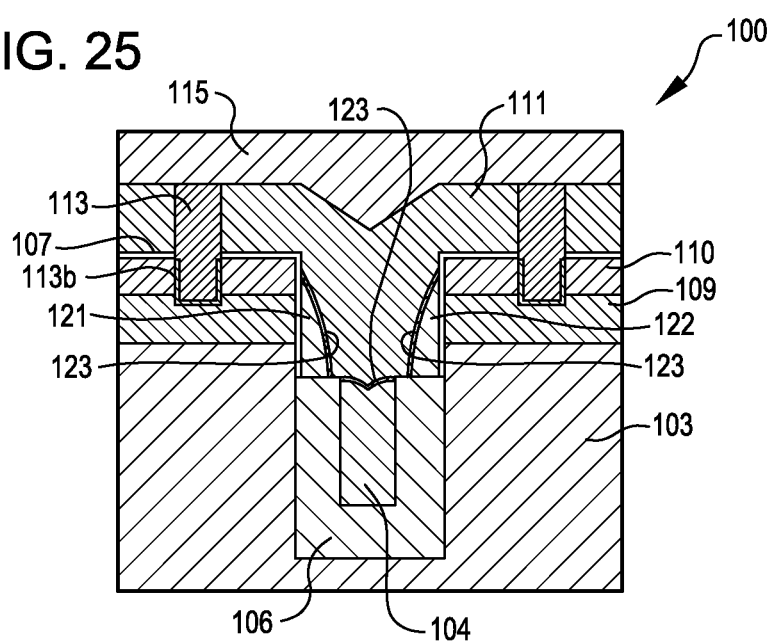

The final step of an embodiment of a method, as shown in FIG. 25, consists in the deposition of a metallic layer 115, for example an alloy of aluminium-silicon-copper (AlSiCu) or of aluminium-copper (AlCu), for the formation of the source electrode and of the gate one (not shown in the figure).

Figure 26A:
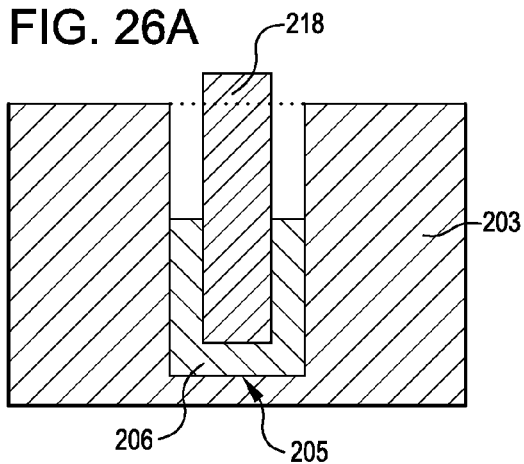
FIGS. 26(A-B) to 29(A-B) show the schematic, section views of a power MOSFET device with a field plate structure during the successive steps of a manufacturing method according to an embodiment.
Figure 26B:
Figure 27A:
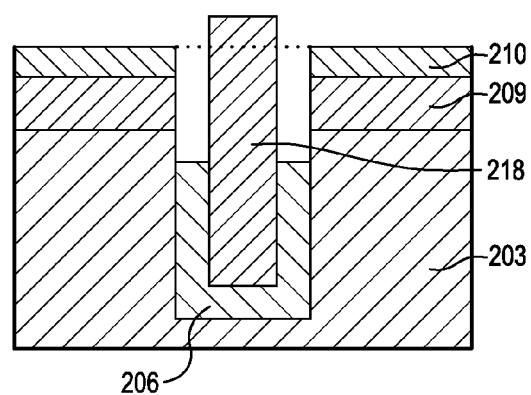
Figure 27A:
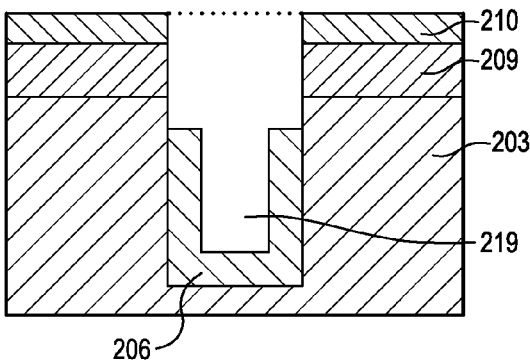
Figure 27B:
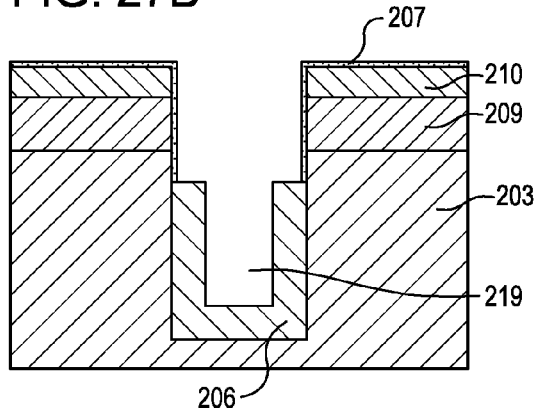

Another embodiment of a method comprises the conventional steps of:

subjecting an epitaxial layer 203 to a first conventional photo-lithographic step for the formation of a deep trench 205;

deposition of a dielectric layer 206, in particular thick oxide, for example TEOS, of thickness F; filling of the trench 205 with a layer of sacrificial material 218, for example resist or bark, silicon nitride or polysilicon; a planarization step of the surface of the epitaxial layer 203; a controlled wet etching of the dielectric layer 206, with retrocession below the surface of the epitaxial layer 203, as shown in FIG. 26A;

implantation of the body region 209 and of the source region 210, as shown in FIG. 26B;

removal of the layer of sacrificial material 218 and formation of an empty region 219 within the layer of sacrificial material 218 and growth of a layer of gate oxide 207, as shown in FIGS. 27A and 27B.

Figure 28A:
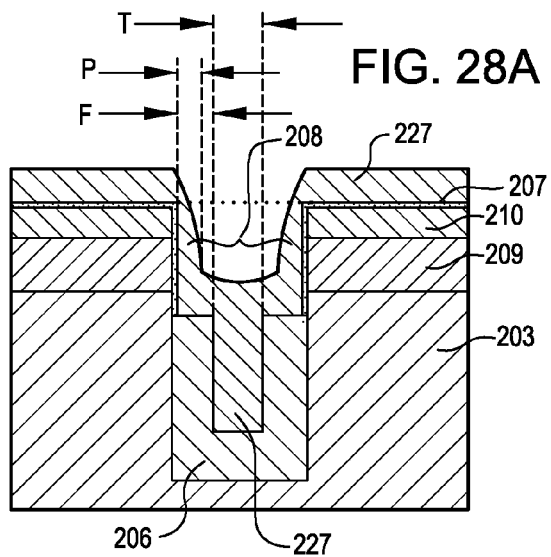
Figure 28B:
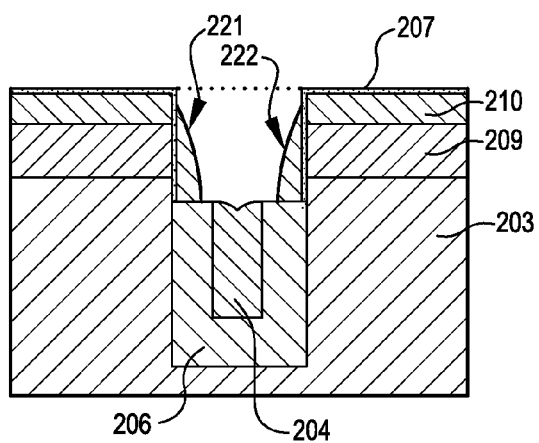
Figure 29A:
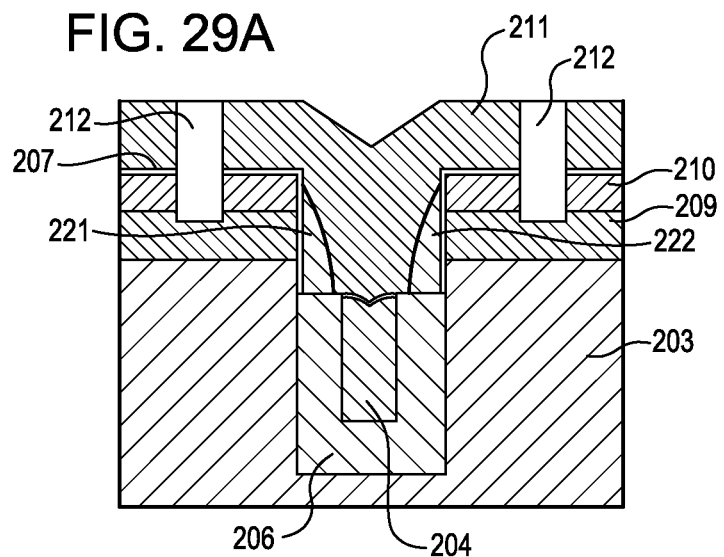
Figure 29B:
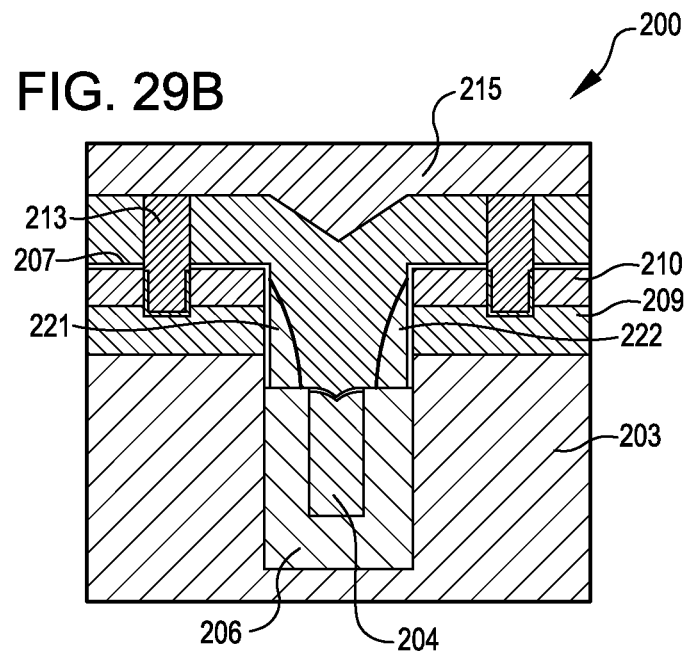

An embodiment of a method goes on with the successive steps of:

deposition of a conductive filling layer, in particular a metallic layer 227, for example tungsten (W-plug), and formation of a first spacer 221 and a second tungsten spacer 222 that serve as a metallic gate electrode 208, further to etching of the metallic layer 227, as shown in FIGS. 28A and 28B; the metallic buried source region 204 is thus formed;

deposition of an insulation dielectric layer 211 and realization of the openings 212 for the contacts, as shown in FIG. 29A;

etching of the silicon for contacting the buried body region 209 under the source region 210 and filling of the openings 212 with a metallic layer (for example tungsten) 213 and deposition of a final metallization layer 215, as shown in FIG. 29B.

An embodiment of the device 200 thus obtained and shown in FIG. 29B, comprising both the metallic gate and buried source electrodes, may turn out to be faster than a polysilicon gate/source device by at least one order of magnitude during the transients. As already indicated, the value Rg of the gate resistance of the device varies according to the material used for realizing the gate itself. In particular, it may be possible to obtain for gates having area equal to 3.2 mm$^2$, the following values of Rg and Rg/mm$^2$:

|  | Rg | Rg/mm$^2$ |
| --- | --- | --- |
| Gate only of polysilicon | 8 | 2.5 |
| Hybrid gate (polysilicon + silicide) | 3.8 | 1.1875 |
| Only metallic gate | 0.5 | 0.15625 |

FIGS. 30-38 show the view from above of a single strip of trenches 105 comprised into the MOSFET device, obtained with a method according to an embodiment, comprising the gate and buried source contacts being realized with a method according to an embodiment but according to different embodiments of the layout geometries.

Figure 30:
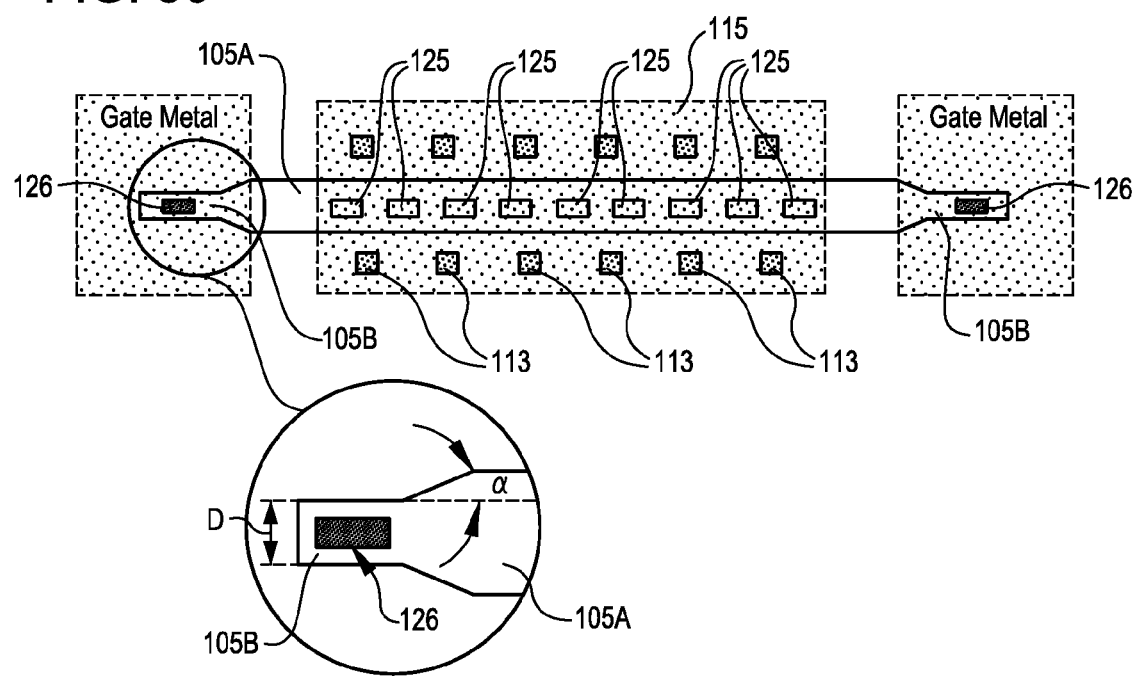
FIGS. 30 and 31 show schematic views from above of an alternative embodiment of a geometry or layout of the gate and buried source contacts respectively for a single trench or for a plurality of trenches comprised into the MOSFET device being realized with a manufacturing method according to an embodiment.

In particular, FIG. 30 shows a view from above of the trench 105 comprising a first and a second narrow portion 105B and an enlarged portion 105A, also with an enlarged view (Zoom) of the gate contact portion 126 (Gate metal). According to a first geometry, in the portions 105B the gate contact 126 is realized, while in the portion 105A the buried source contacts 125 are positioned.

Figure 31:
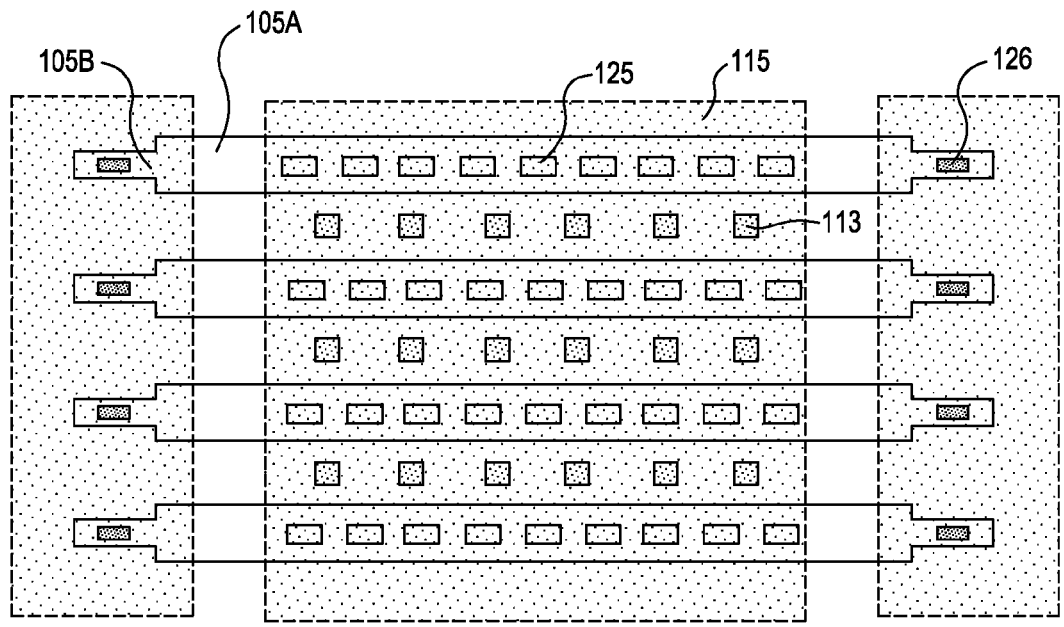

FIG. 31 shows a view from above of a plurality of strips of trenches 105 with narrowing having a close layout of the buried source contacts 125 according to an embodiment shown in FIG. 30. In this case the distance between a contact and the successive one may be compared to the same dimension of the contact.

Figure 32:
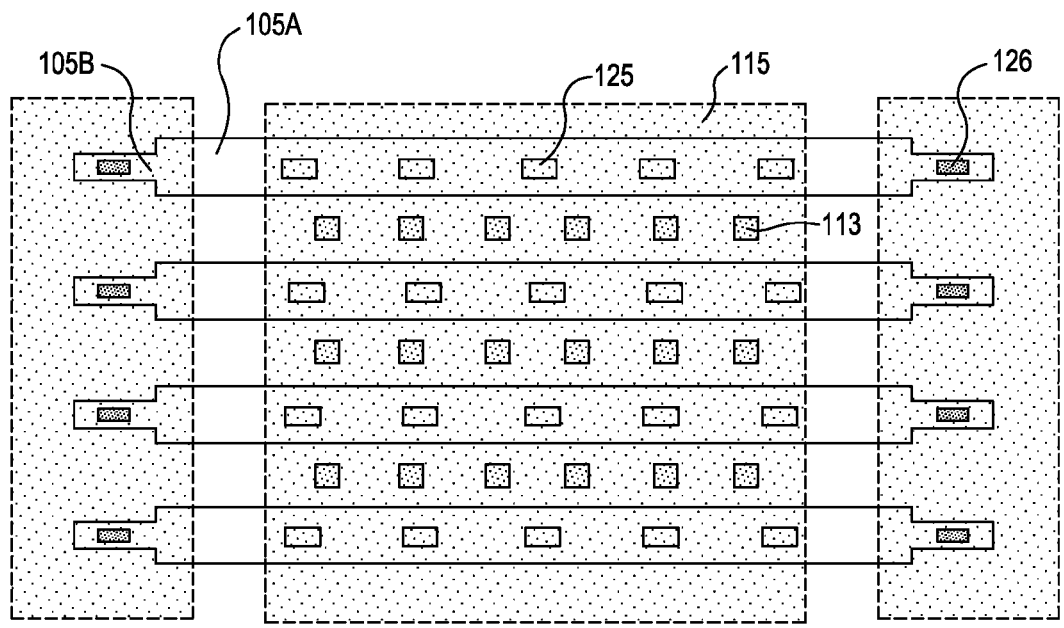
FIG. 32 shows the schematic view from above of another embodiment of a layout of the gate and buried source contacts for a plurality of trenches comprised into the MOSFET device being realized with a manufacturing method according to an embodiment.

FIG. 32 shows a view from above of a plurality of strips of trenches 105 with narrowing having a spaced layout of the buried source contacts 125, according to a second geometry of the contacts. In this case the distance between a contact and the successive one is at least approximately 10 times greater than the dimension of the contact.

Figure 33:
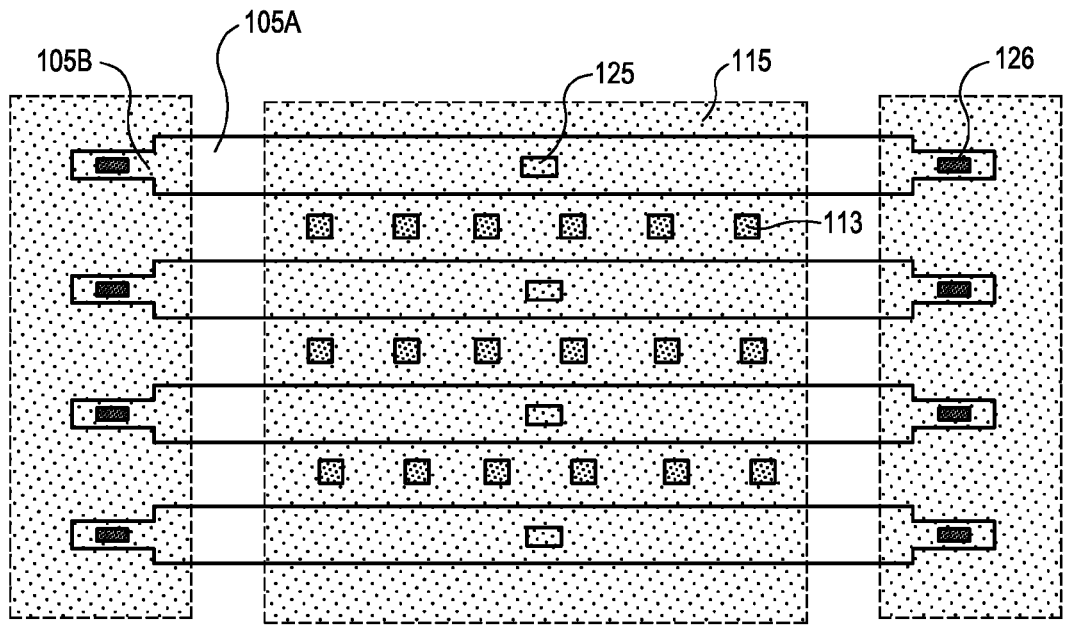
FIG. 33 shows the schematic view from above of another embodiment of a layout of the gate and buried source contacts for a plurality of trenches comprised into the MOSFET device being realized with a the manufacturing method according to an embodiment.

FIG. 33 shows a view from above of a plurality of strips of trenches 105 with narrowing having a single buried source contact 125 positioned in the middle of the portion 105A of the trench 105, according to a third geometry of the contacts.

Figure 34:
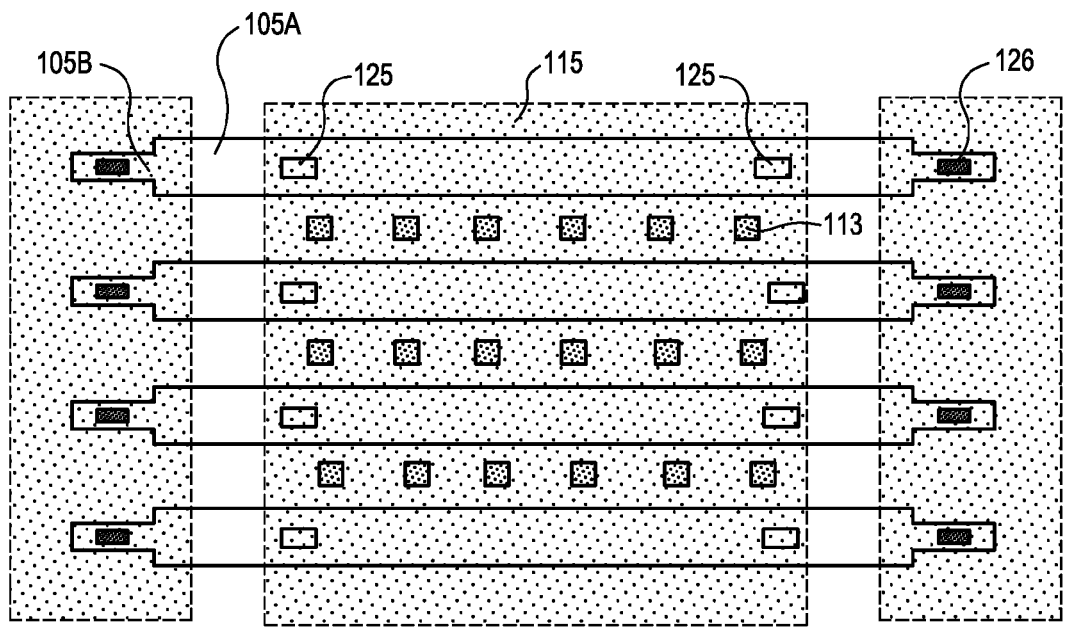
FIG. 34 shows the schematic view from above of another embodiment of a layout of the gate and buried source contacts for a plurality of trenches comprised into the MOSFET device being realized with a manufacturing method according to an embodiment.

FIG. 34 shows a view from above of a plurality of strips of trenches 105 with narrowing having a first and a second buried source contact 125 positioned at the edge of the portion 105A of the trench 105, according to a fourth geometry of the contacts.

Figure 35:
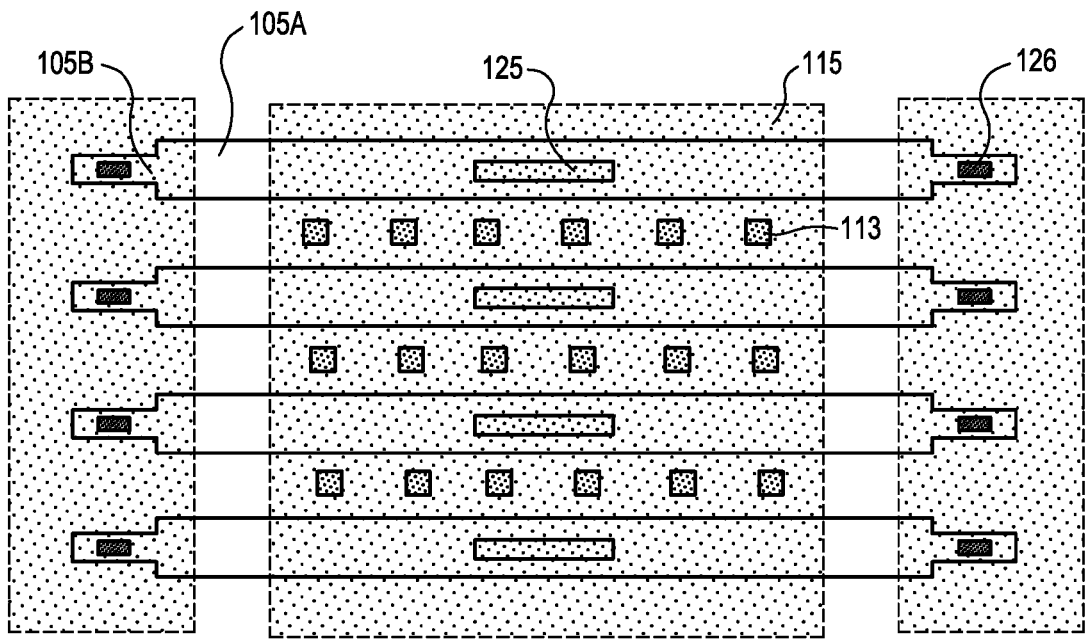
FIG. 35 shows the schematic view from above of another embodiment of a layout of the gate and buried source contacts for a plurality of trenches comprised into the MOSFET device being realized with a manufacturing method according to an embodiment.

FIG. 35 shows a view from above of a plurality of strips of trenches 105 with narrowing having a single wide buried contact 125 positioned in the middle of the portion 105A of the trench 105, according to a fifth geometry of the contacts. In this case the ratio between the greater dimension and the smaller one of the single wide buried contact is at least approximately 10.

Figure 36:
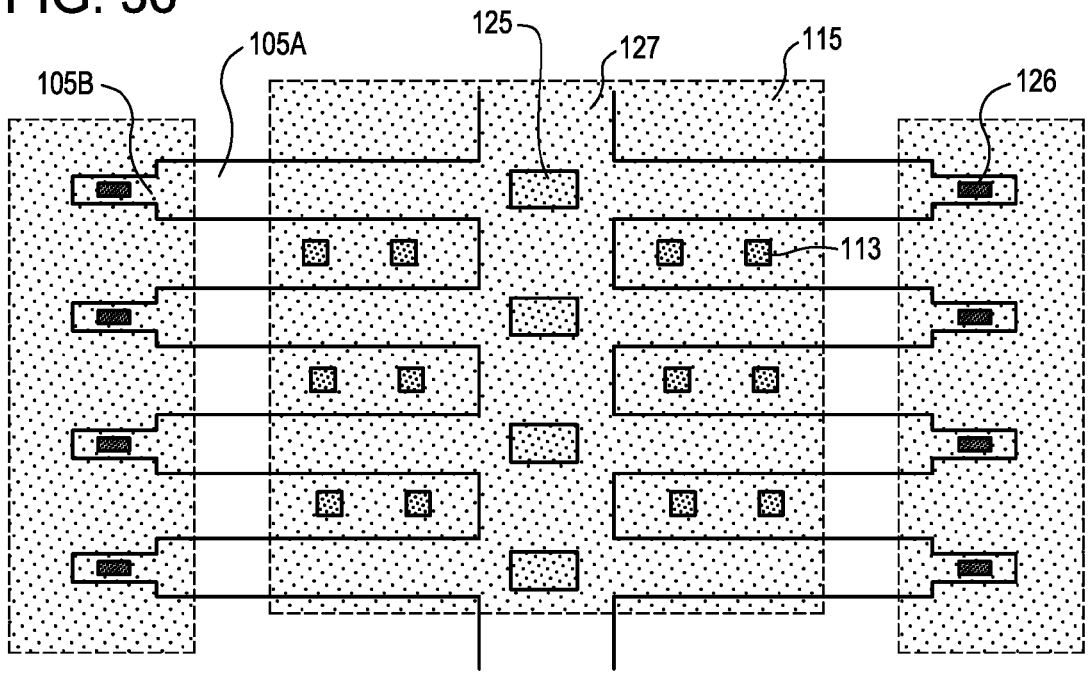
FIG. 36 shows the schematic view from above of another embodiment of a layout of the gate and buried source contacts for a plurality of trenches comprised into the MOSFET device being realized with a manufacturing method according to an embodiment.

FIG. 36 shows a view from above of a plurality of strips of trenches 105 with narrowing having a single wide buried source contact 125 positioned within a source finger 127 realized in the middle of the portion 105A of the trench 105 and shared by all the trenches 105, according to a sixth geometry of the contacts.

Figure 37:
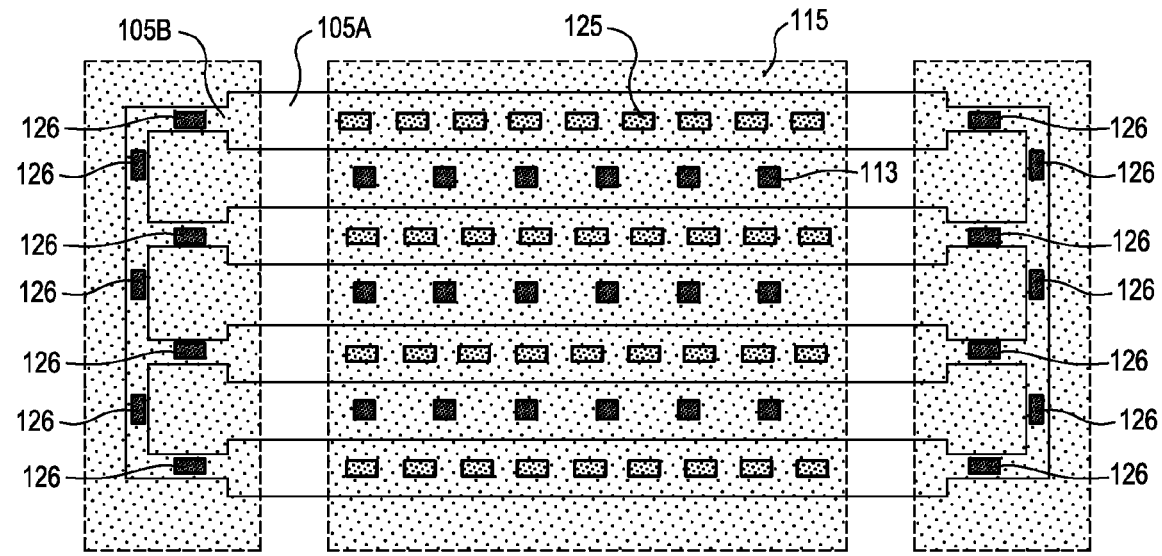
FIG. 37 shows the schematic view from above of another embodiment of a layout of the gate and buried source contacts for a plurality of trenches comprised into the MOSFET device being realized with a manufacturing method according to an embodiment.

FIG. 37 shows a view from above of a plurality of strips of trenches 105 with narrowing having a layout of the buried source contacts 125 according to one of the embodiments shown in FIGS. 31 to 36 and with a chain of gate contacts 126 arranged on an edge shared by all the trenches 105, according to a seventh geometry of the contacts.

Figure 38:
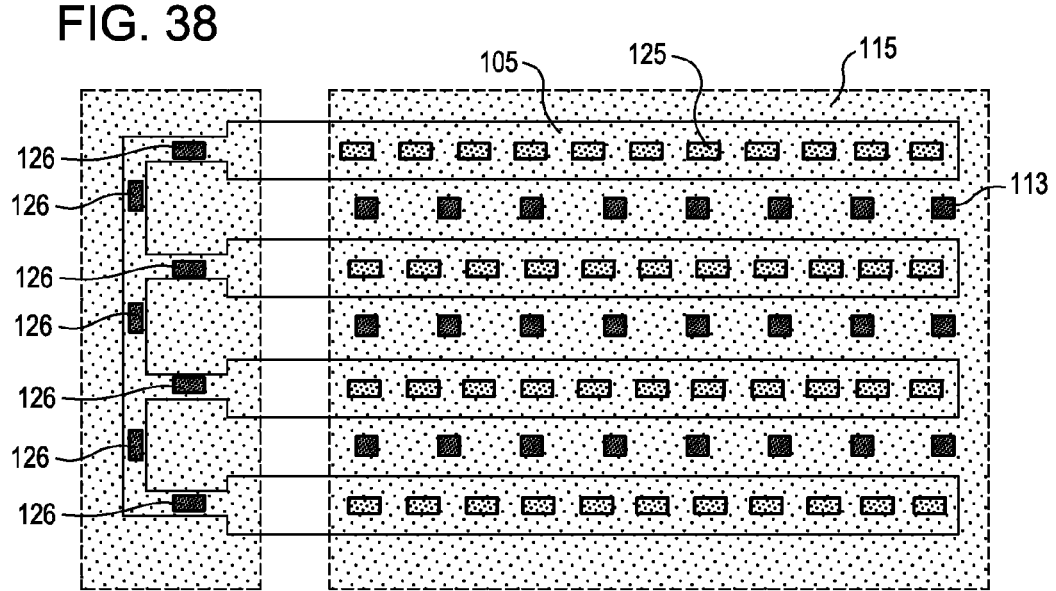
FIG. 38 shows the schematic view form above of another embodiment of the layout of the gate and buried source contacts for a plurality of trenches comprised into the MOSFET device being realized with a manufacturing method according to an embodiment.

FIG. 38 shows a view from above of an eighth geometry of contacts relative to a plurality of strips of trenches 105 comprising a narrow portion 105B and an enlarged portion 105A, according to an embodiment of the trench that has a narrowing only at one end, with an arrangement of the buried source contacts 125 according to one of the embodiments shown in FIGS. 31 to 36 and with a chain of gate contacts 126 arranged on an edge shared by all the trenches 105 in correspondence with the narrow portion 105B.

In conclusion, a method according to an embodiment allows, differently from conventional solutions that use a double deposition and polysilicon masking, to execute a single polysilicon deposition step and a single dry anisotropic etching for simultaneously realizing the gate and buried source electrodes of a power device with a field-plate structure, through the use of an asymmetric trench structure comprising a narrowing in its end portion.

Therefore, an embodiment of a method may allow reducing the presence of faults on a wafer due to the reductions of successive steps and to reduce the manufacturing costs of the device.

Another advantage of an embodiment is that the effects of the overlapping of parasitic capacities between the gate and buried source electrodes may be reduced.

Furthermore, a method according to an embodiment allows obtaining a better control of the gate resistance Rg by realizing the gate electrode with metallic or metallic silicide spacer.

Finally, a further advantage of an embodiment of a method is that, by distributing the buried source contacts according, e.g., to the configurations above described and shown in FIGS. 31 to 38, a better control of the switching of the power device between the turn-on step and the switching-off step according to the application may be obtained.

An embodiment of the above-described MOSFET Device may be part of a system (e.g. an automotive system), and the system may include an integrated circuit (e.g. a processor) coupled to the MOSFET Device. Furthermore, the MOSFET Device & Integrated circuit may be disposed on a same or on respective semiconductor dies.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A power device, comprising:
a drain region;
a body region disposed over the drain region;
a first source region disposed over the body region;
a gate insulator disposed adjacent to the body region;
a gate region having a first portion disposed adjacent to the gate insulator and having a second portion set apart from the first portion;
a source insulator disposed adjacent to the drain region; and
a second source region disposed adjacent to the source insulator and flanked by the first and second portions of the gate region.

2. The power device of claim 1 wherein at least one portion of the gate region is disposed over the source insulator.

3. The power device of claim 1 wherein at least one portion of the gate region is disposed on the source insulator.

4. The power device of claim 1 wherein:
at least one portion of the gate region is disposed over the source insulator; and
the source insulator is thicker than the gate region.

5. The power device of claim 1, further comprising:
a trench having a sidewall adjacent to the drain, body, and first source regions;
wherein the gate insulator is disposed over a first portion of the sidewall; and
wherein the source insulator is disposed over a second portion of the sidewall that is under the first portion of the sidewall.

6. The power device of claim 1, further comprising:
a drain contact disposed in contact with the drain region;
a source-body contact disposed in contact with the body and first source regions;
a gate contact disposed in contact with at least one portion of the gate region; and
a source contact disposed in contact with the second source region.

7. The power device of claim 6, further comprising:
a substrate;
an epitaxial layer disposed over the substrate;
wherein a first portion of the drain region is disposed in the substrate and a second portion of the drain region is disposed in the epitaxial layer; and
wherein the body region and source region are disposed in the epitaxial layer.

8. The power device of claim 6, further comprising:
a substrate;
an epitaxial layer disposed over the substrate;
wherein a first portion of the drain region is disposed in the substrate and a second portion of the drain region is disposed in the epitaxial layer;
wherein the body region and source region are disposed in the epitaxial layer; and
a drain contact disposed in contact with the substrate.

9. The power device of claim 1, further comprising:
a drain contact disposed in contact with the drain region;
a source-body contact disposed in contact with the body and first source regions;
a gate contact disposed in contact with at least one portion of the gate region;
a source contact disposed in contact with the second source region; and
a conductor disposed in contact with the source-body and source contacts.

10. The power device of claim 1, further comprising:
an epitaxial layer; and
wherein the drain region, body region, and source region are disposed in the epitaxial layer.

11. A power device, comprising:
a drain region;
a body region disposed over the drain region;
a first source region disposed over the body region;
a gate insulator disposed adjacent to the body region;
a gate region disposed adjacent to the gate insulator, the gate region having a source insulator disposed adjacent to the drain region and a second source region disposed adjacent to the source insulator;
a trench having first region and a second region that is wider than the first region, the first and second regions having respective first and second sidewalls, at least the second sidewall being adjacent to the drain, body, and first source regions;
wherein the gate insulator is disposed over respective first portions of the first and second sidewalls; and
wherein the source insulator is disposed over respective second portions of the first and second sidewalls that are under the respective first portions of the first and second sidewalls.

12. The power device of claim 11,
wherein the second source region is disposed adjacent to the source insulator only in the second region of the trench.

13. The power device of claim 11, further comprising:
wherein the second sidewall having a portion that forms an approximately right angle with the first sidewall.

14. The power device of claim 11, further comprising:
a trench having first region and a second region that is wider than the first region, the first and second regions having respective first and second sidewalls, at least the second sidewall being adjacent to the drain, body, and first source regions, wherein the second sidewall having a portion that forms an acute angle with the first sidewall.

15. The power device of claim 11, further comprising:
a trench having first region and a second region that is wider than the first region, the first and second regions having respective first and second sidewalls, at least the second sidewall being adjacent to the drain, body, and first source regions, wherein the second sidewall having a portion that forms an obtuse angle with the first sidewall.

\* \* \* \* \*